(12) United States Patent
Hu et al.

(10) Patent No.: US 9,087,543 B2
(45) Date of Patent: Jul. 21, 2015

(54) SPIN TORQUE MRAM HAVING PERPENDICULAR MAGNETIZATION WITH OXIDE INTERFACE

(71) Applicant: International Business Machines Corporation, Armonk, NY (US)

(72) Inventors: Guohan Hu, Yorktown Heights, NY (US); Daniel Worledge, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 13/911,609

(22) Filed: Jun. 6, 2013

(65) Prior Publication Data

US 2014/0363701 A1  Dec. 11, 2014

(51) Int. Cl.
| | |
|---|---|
| *G11C 11/16* | (2006.01) |
| *G11B 5/84* | (2006.01) |
| *G11B 5/62* | (2006.01) |
| *H01L 43/08* | (2006.01) |
| *H01L 43/12* | (2006.01) |

(52) U.S. Cl.
CPC ............. *G11B 5/8404* (2013.01); *G11B 5/62* (2013.01); *G11C 11/16* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 5,290,609 A | 3/1994 | Horiike et al. | |
| 7,727,911 B2 | 6/2010 | Yoneda et al. | |
| 8,183,652 B2 | 5/2012 | Ranjan et al. | |
| 8,283,741 B2 | 10/2012 | Hu et al. | |
| 8,324,697 B2 | 12/2012 | Worledge | |
| 8,493,695 B1 | 7/2013 | Kaiser et al. | |
| 2003/0228497 A1* | 12/2003 | Wu et al. | 428/694 TP |
| 2005/0185455 A1 | 8/2005 | Huai | |
| 2005/0231854 A1 | 10/2005 | kawai | |
| 2008/0088980 A1* | 4/2008 | Kitagawa et al. | 360/313 |
| 2010/0096716 A1 | 4/2010 | Ranjan et al. | |
| 2012/0018823 A1 | 1/2012 | Huai et al. | |
| 2012/0063218 A1* | 3/2012 | Huai et al. | 365/171 |
| 2012/0087185 A1 | 4/2012 | Zhou et al. | |
| 2012/0135273 A1 | 5/2012 | Horng et al. | |
| 2012/0175717 A1 | 7/2012 | Bessho et al. | |
| 2012/0188818 A1 | 7/2012 | Ranjan et al. | |
| 2012/0205758 A1 | 8/2012 | Jan et al. | |
| 2012/0217595 A1 | 8/2012 | Zhou et al. | |
| 2012/0236631 A1 | 9/2012 | Park et al. | |
| 2012/0241878 A1 | 9/2012 | Hu et al. | |
| 2012/0280336 A1 | 11/2012 | Jan et al. | |
| 2012/0295370 A1 | 11/2012 | Zhou et al. | |
| 2013/0175644 A1 | 7/2013 | Horng et al. | |
| 2014/0048893 A1 | 2/2014 | Wu et al. | |

OTHER PUBLICATIONS

Choi et al.. "L10 ordering of FePtB films on a thin MgO layer", Applied Physics Express 4, Jan. 2011, (023001, pp. 1-3).*

(Continued)

*Primary Examiner* — Holly Rickman

(74) *Attorney, Agent, or Firm* — Cantor Colburn LLP; Vazken Alexanian

(57) ABSTRACT

A mechanism is provided for a structure with perpendicular magnetic anisotropy. A bottom oxide layer is disposed, and a magnetic layer is disposed adjacent to the bottom oxide layer. The magnetic layer includes iron and is magnetized perpendicularly to a plane of the magnetic layer. A top oxide layer is disposed adjacent to the magnetic layer.

6 Claims, 8 Drawing Sheets

(56) References Cited

OTHER PUBLICATIONS

T.-I. Cheng et al., "Perpendicular magnetic anisotropy induced by a cap layer in ultrathin MgO/CoFeB/Nb," Journal of Applied Physics, vol. 112, No. 3, 2012, 033910, 4 pages.

G. Jan et al., "High Spin Torque Efficiency of Magnetic Tunnel Junctions with MgO/CoFeB/MgO Free Layer," Applied Physics Express, vol. 5, No. 9, 2012, 093008, 3 pages.

J. H. Jung et al., "Strong perpendicular magnetic anisotropy in thick CoFeB films sandwiched by Pd and MgO layers," Applied Physics Letters, vol. 96, No. 4, 2010, 042503, 3 pages.

T. Liu et al., "Large enhanced perpendicular magnetic anisotropy in CoFeB/MgO system with the typical Ta buffer replaced by an Hf layer," AIP Advances, vol. 2, No. 3, 2012, 032151, 7 pages.

V. B. Naik et al., "Thick CoFeB with perpendicular magnetic anisotropy in CoFeB-MgO based magnetic tunnel junction," AIP Advances 2, No. 4, 2012, 042182, 9 pages.

J. J. Nowak, et al., "Demonstration of ultralow bit error rates for spin-torque magnetic random-access memory with perpendicular magnetic anisotropy." IEEE Magnetics Letters, vol. 2, 2011, 3000204, 4 pages.

Sato et al., "Perpendicular-anisotropy CoFeB-MgO magnetic tunnel junctions with a MgO/CoFeB/Ta/CoFeB/MgO recording structure," Applied Physics Letters 101, 022414 (2012), 5 pages.

D. C Worledge et al., "Spin torque switching of perpendicular Ta ? CoFeB ? MgO-based magnetic tunnel junctions," Applied Physics Letters, vol. 98, 2011, 022501, 4 pages.

* cited by examiner

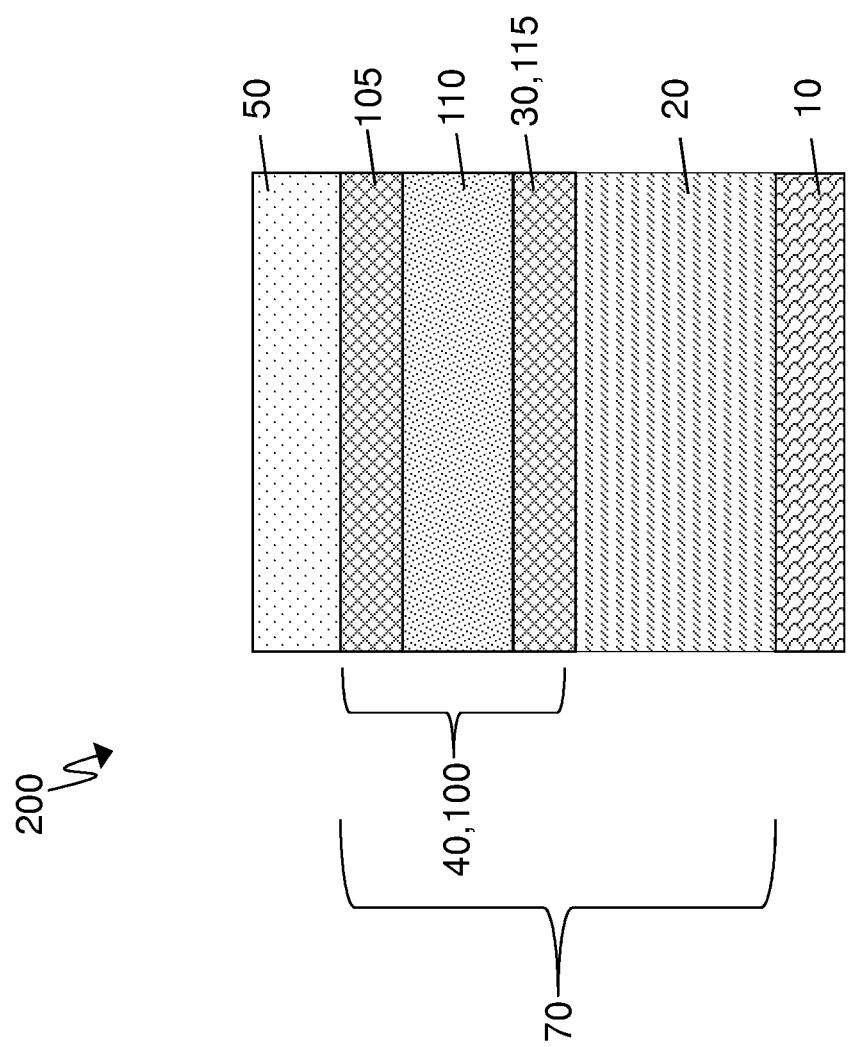

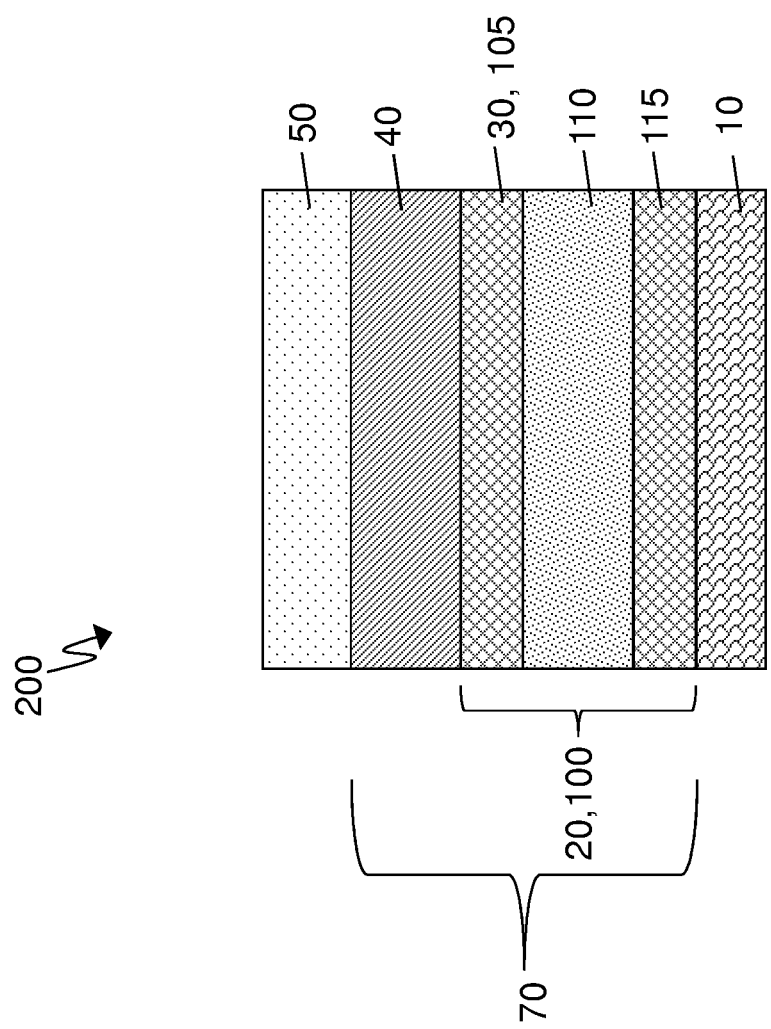

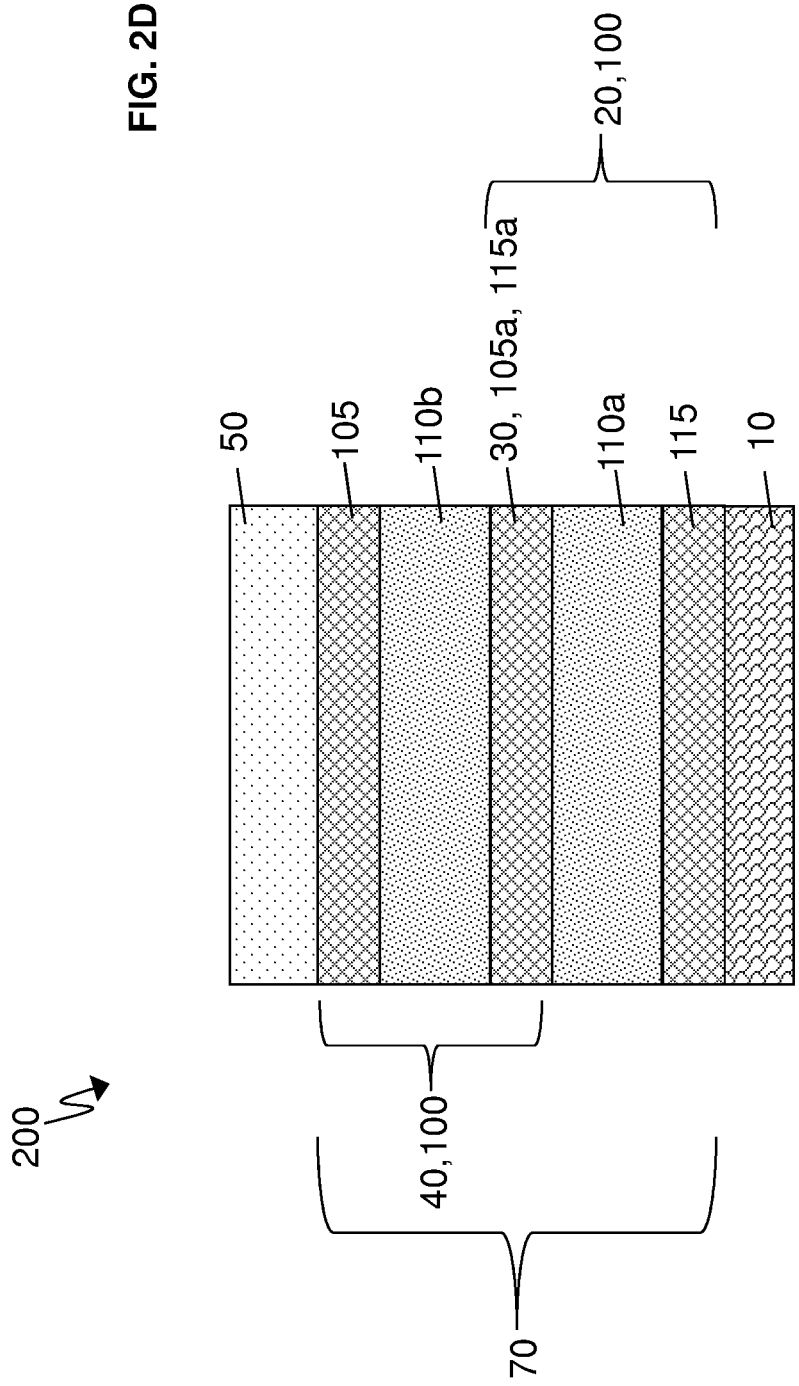

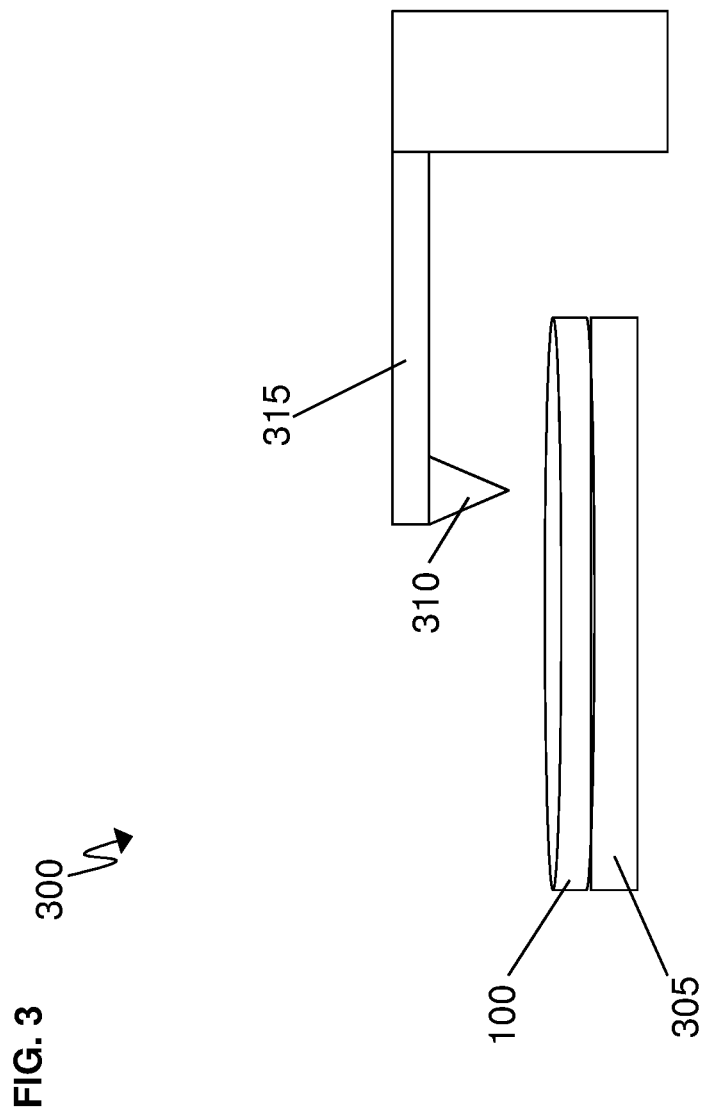

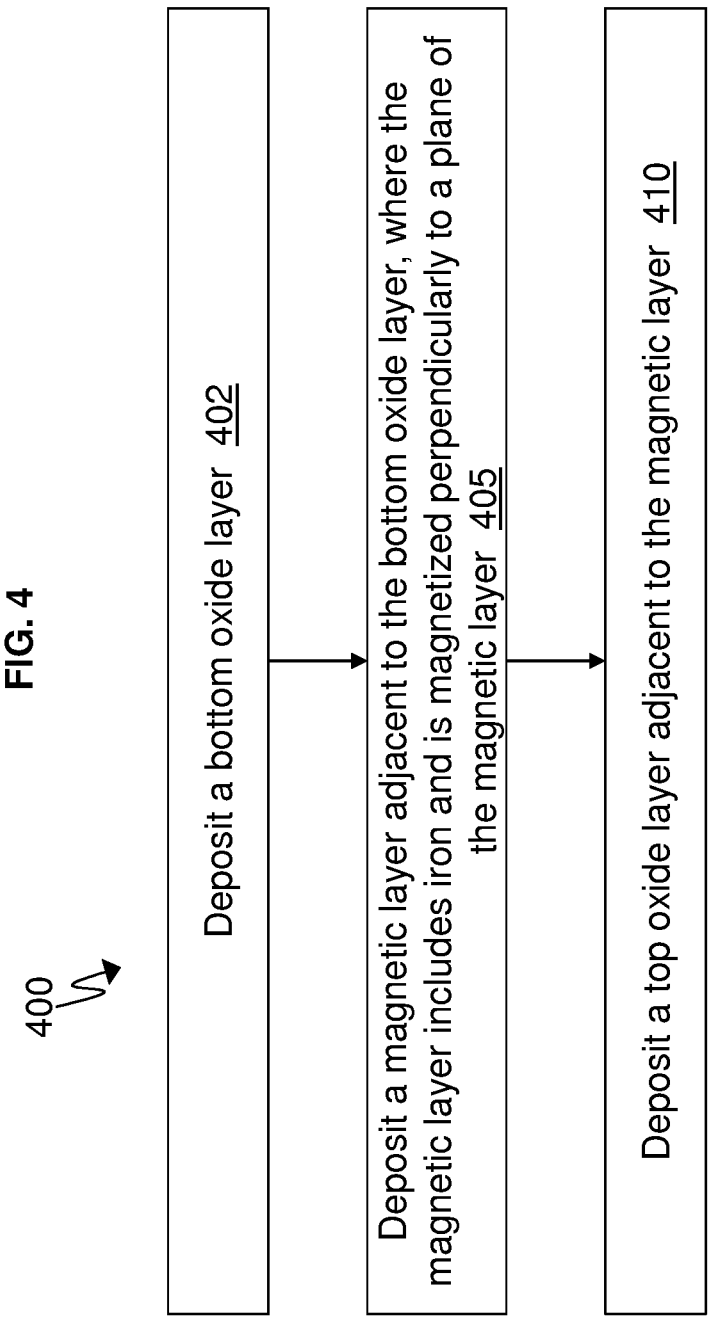

SPIN TORQUE MRAM HAVING PERPENDICULAR MAGNETIZATION WITH OXIDE INTERFACE

BACKGROUND

The present invention relates generally to magnetic memory and magnetic storage devices, and more specifically, to materials in and configurations for a device with perpendicular magnetization.

Spin transfer torque is an effect in which the orientation of a magnetic layer in a magnetic tunnel junction or spin valve can be modified using a spin-polarized current. Charge carriers (such as electrons) have a property known as spin which is a small quantity of angular momentum intrinsic to the carrier. An electrical current is generally unpolarized (consisting of 50% spin-up and 50% spin-down electrons). A spin polarized current is one with more electrons of either spin. By passing a current through a thick magnetic layer, one can produce a spin-polarized current. If a spin-polarized current is directed into a magnetic layer, angular momentum can be transferred to the magnetic layer, changing its magnetic orientation. This can be used to flip the orientation of the magnet.

SUMMARY

According to an exemplary embodiment, a structure with perpendicular magnetic anisotropy is provided. The structure includes a bottom oxide layer, and a magnetic layer adjacent to the bottom oxide layer. The magnetic layer includes iron and is magnetized perpendicularly to a plane of the magnetic layer. A top oxide layer is adjacent to the magnetic layer.

According to another exemplary embodiment, a method of forming a structure with perpendicular magnetic anisotropy is provided. The method includes depositing a bottom oxide layer, and depositing a magnetic layer adjacent to the bottom oxide layer. The magnetic layer includes iron and is magnetized perpendicularly to a plane of the magnetic layer. A top oxide layer is deposited adjacent to the magnetic layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2B illustrates an example of the STT-RAM device in which the free magnetic layer is implemented with the three layer device according to an embodiment.

FIG. 2C illustrates an example of the STT-RAM device in which the reference magnetic layer is implemented with the three layer device according to an embodiment.

FIG. 2D illustrates an example of the STT-RAM device in which the free magnetic layer and reference magnetic layer are respectively implemented with separate three layer devices according to an embodiment.

FIG. 3 illustrates a hard disk drive (HDD) with the three layer device according to an embodiment.

FIG. 4 illustrates a method for forming a three layer structure device with perpendicular magnetic anisotropy according to an embodiment.

DETAILED DESCRIPTION

An embodiment discloses a device with perpendicular magnetization that may be utilized in various applications.

Dense spin torque MRAM requires magnetic layers with magnetization perpendicular to the plane with large magnetic anisotropy, and compatible with MgO to give high magnetoresistance. State of the art work has shown that Ta|CoFeB|MgO satisfies these requirements.

However, the anisotropy may not be large enough to make devices for the 20 nanometer node size and below. Also, magnetic layers with magnetization perpendicular to the plane with large magnetic anisotropy would also be useful for hard disk drive storage media.

Magnetic anisotropy is the directional dependence of a material's magnetic properties. In the absence of an applied magnetic field, a magnetically isotropic material has no preferential direction for its magnetic moment, while a magnetically anisotropic material will align its moment with one of the easy axes (as discussed herein perpendicular magnetic anisotropy (PMA) is aligned perpendicularly). An easy axis is an energetically favorable direction of spontaneous magnetization that is determined by the sources of magnetic anisotropy.

Embodiments disclose structures that have high perpendicular magnetic anisotropy energy density. Perpendicular magnetic anisotropy energy density refers to the product of free layer saturation magnetization $M_s$, free layer thickness t, and perpendicular anisotropy field $H_k$.

Figure 1A:
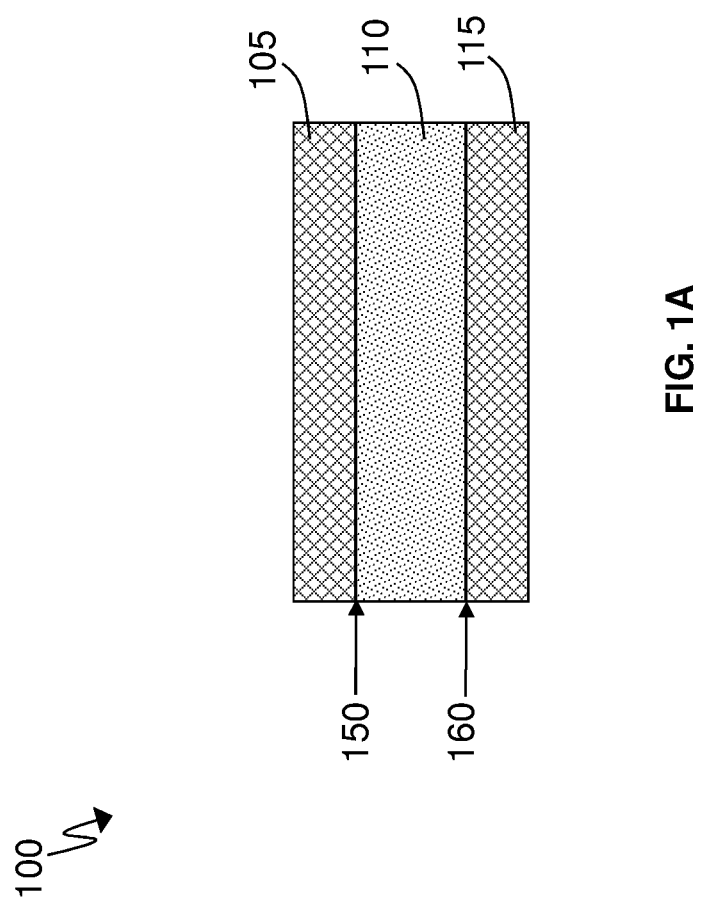
FIG. 1A illustrates a cross-sectional view of a three layer device with perpendicular magnetic anisotropy according to an embodiment.

Now turning to the figures, FIG. 1 illustrates a cross-sectional view of a three layer device 100 with perpendicular magnetic anisotropy according to an embodiment. The device 100 includes a magnetic layer 110 containing iron (Fe), sandwiched in between a top oxide layer 105 and a bottom oxide layer 115. As understood by one skilled in the art, the oxide layers contain oxygen.

Figure 1B:
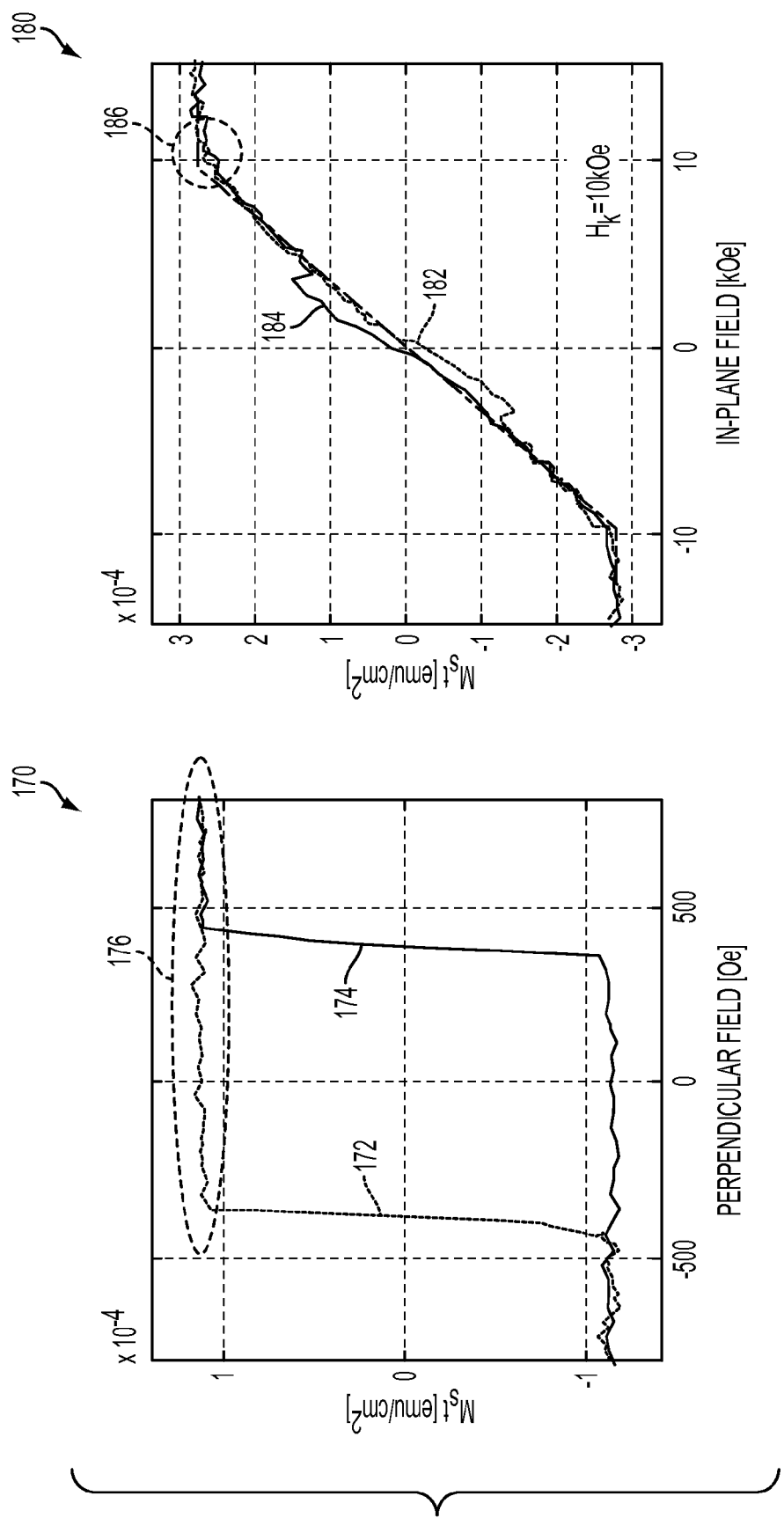
FIG. 1B illustrates a graph of the perpendicular magnetic field and a graph of the in-plane magnetic field according to an embodiment.

In the device 100, the Fe—O bonds on both interfaces 150 and 160 to produce very large perpendicular magnetic anisotropy (i.e., vertical magnetization in device 100). In other words, the iron of the magnetic layer 110 bonds with the oxygen in the top oxide layer 105 at interface 150 and the iron of the magnetic layer 110 bonds with the oxygen in the bottom oxide layer 115 at interface 160 to produce the large perpendicular magnetic anisotropy for the device 100. The device 100 provides a simple perpendicular material system with large perpendicular magnetic anisotropy that can be utilized in various applications as discussed further herein. As compared to CoFeB layers with a single oxide interface, the $M_s t H_k$ of samples with double oxide interfaces can be improved by 5× or more. FIG. 1B shows one example of such a structure where the bottom oxide layer is MgO and top oxide layer is MgTiOx. In this particular sample, the $M_s t H_k$ product is ~1.1 ergs/cm$^2$, compared to ~0.2 erg/cm$^2$ for a typical MgO|CoFeB|Ta sample.

In FIG. 1B, a chart 170 shows the magnetic perpendicular field (i.e., vertical) strength (in Oersteds (Oe)) on the horizontal axis and shows the moment ($M_s t$ in emu/cm$^2$) on the vertical axis for the structure, where EMU is the electromagnetic unit. The line 172 shows the measured magnetic moment when a perpendicular magnetic field is applied which traverses from a positive magnetic field (e.g., +800 Oe) to negative magnetic field (e.g., −800 Oe). Line 174 shows the measured magnetic moment when the perpendicular magnetic field is applied which traverse from a negative magnetic field (e.g., −800 Oe) to positive magnetic field (e.g., +800 Oe). In chart 170, the saturation moment (when the perpendicular magnetic field is applied) is denoted by 176.

In FIG. 1B, a chart 180 shows the magnetic in-plane field (i.e., horizontal) strength (in kilo Oersteds (kOe)) on the horizontal axis and shows the moment ($M_s t$ in emu/cm$^2$) on the vertical axis for the structure. The line 182 shows the measured magnetic moment when the in-plane magnetic field is applied which traverses from a positive magnetic field (e.g., +15 kOe) to negative magnetic field (e.g., −15 kOe). Line 184 shows the measured magnetic moment when the in-plane magnetic field is applied which traverse from a negative magnetic field (e.g., −15 kOe) to positive magnetic field (e.g., +15 kOe). In chart 180, the saturation in-plane magnetic field is denoted by 186 and the value is $H_k$=10 kOe.

$M_s$ is the saturation magnetization of the free layer material, t is the thickness of the free layer, and $H_k$ is the perpendicular anisotropy field of the free layer. The $M_s t H_k$ product is referred to as energy density. For a given device size, the higher the $M_s t H_k$ product, the higher the thermal activation energy barrier which translates to better retention. Perpendicular magnetic anisotropy energy density refers to the product of free layer saturation magnetization $M_s$, free layer thickness t, and perpendicular anisotropy field $H_k$.

The device 100 is compatible with MgO for high magnetoresistance if one of the oxide layers 105 and/or 115 is MgO.

The device 100 can be formed as discussed below. The bottom oxide layer 115 is grown first, and then the Fe-containing magnetic layer 110 is grown on top of the bottom oxide layer 115. Next, the top oxide layer 105 is grown on top of the magnetic layer 110.

The top oxide layer 105 may include MgO, AlO$_x$, HfO$_x$, TiO$_x$, TaO$_x$, CuO$_x$, VO$_x$, RuO$_x$, SiO$_x$, WO$_x$, BO$_x$, CaO$_x$, ScO$_x$, ZnO$_x$, CrO$_x$, MnO$_x$ and/or any other oxide, including combinations of oxides, mulitcomponent oxides, and multilayered oxides. Also, the bottom oxide layer 115 may include MgO, AlO$_x$, HfO$_x$, TiO$_x$, TaO$_x$, CuO$_x$, VO$_x$, RuO$_x$, SiO$_x$, WO$_x$, BO$_x$, CaO$_x$, ScO$_x$, ZnO$_x$, CrO$_x$, MnO$_x$, and/or any other oxide, including combinations of oxides, mulitcomponent oxides, and multilayered oxides. The "x" subscript is a variable that represents the number of atoms of the oxygen element (to form the oxide), which can apply to any varied number of atoms suitable for the compound of an oxide as understood by one skilled in the art.

The Fe-containing magnetic layer 110 may include Fe, CoFe, CoFeB, CoFeBTa, and/or any other Fe-containing magnetic layer, including combinations of magnetic materials, magnetic alloys, and multilayered magnetic materials, as long as the materials (of the magnetic layer 110) at the interfaces 150 and 160 with the oxides contain Fe. A particular embodiment is MgO|CoFeB|MgO, where the bottom oxide layer 115 is MgO, the magnetic layer 110 is CoFeB, and the top oxide layer 105 is MgO.

The Fe-containing magnetic layer 110 may be 10-50 angstroms (Å) thick. The top oxide layer 105 may be 2-20 angstroms thick. The bottom oxide layer 115 may be 2-20 angstroms thick.

The device 100 may be utilized in a spin torque MRAM device (as the free layer, and/or reference layers (or part of the reference layers)), as the media in hard disk drives, and/or in any other application where a perpendicularly magnetized structure is needed.

Figure 2A:
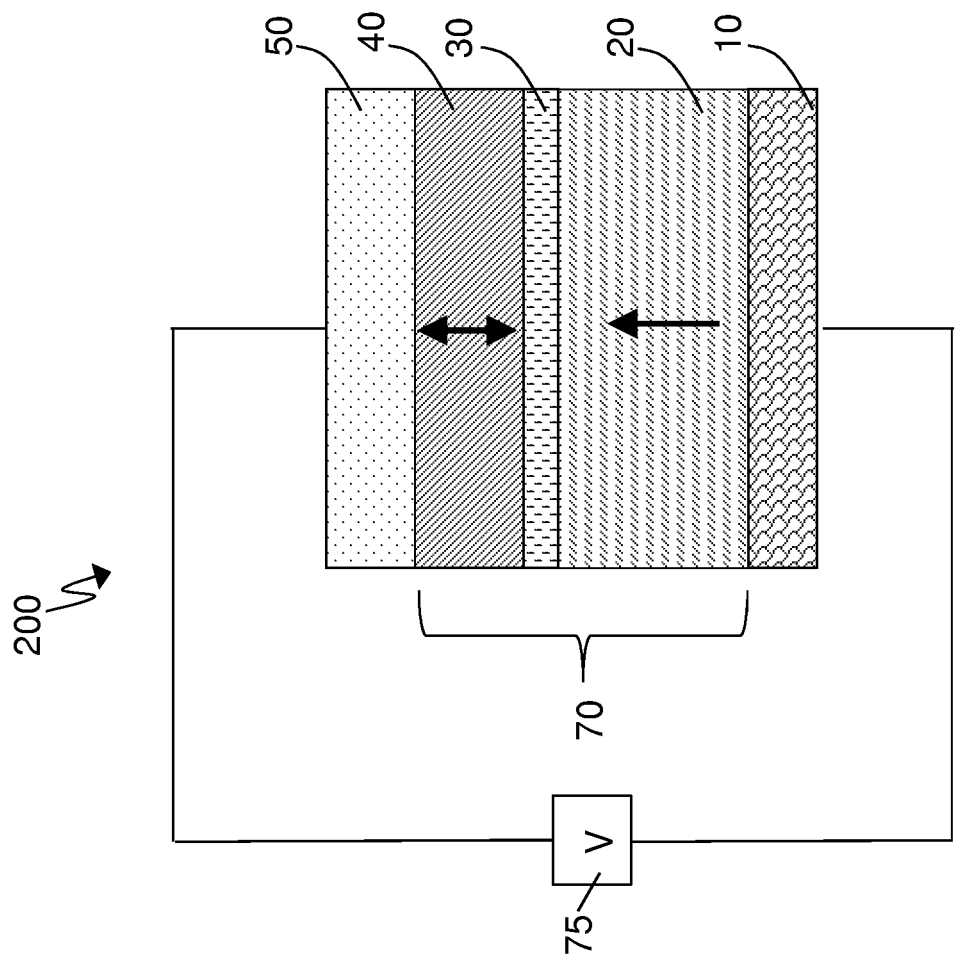
FIG. 2A illustrates a cross-sectional view of a spin torque transfer random access memory (STT-RAM) device according to an embodiment.

There are various applications for the device 100, and a few examples are discussed in FIGS. 2A, 2B, 2C, and 2D (generally referred to as FIG. 2). FIG. 2A illustrates a cross-sectional view of a spin torque transfer random access memory (STT-RAM) device 200 according to an embodiment. The device 100 may replace a reference magnetic layer 20, part of a reference magnetic layer 20, and/or a free magnetic layer 40 in the STT-RAM device 200. The device structure of the STT-RAM device 100 includes a magnetic tunnel junction (MTJ) 70. The magnetic tunnel junction 70 has a reference magnetic layer 20, a tunnel barrier 30 on the reference magnetic layer 20, and a free magnetic layer 40 on the tunnel barrier 30. The reference magnetic layer 20 is on a seed layer 10. The seed layer 10 may be one or more different materials (depending on the exact reference magnetic layer 20) to grow the reference magnetic layer 20. A cap layer 50 is disposed on top of the free magnetic layer 40. The reference magnetic layer 20 and the free magnetic layer 40 sandwich the tunnel barrier 30 in between. The tunnel barrier 30 is a thin insulator (typically a few nanometers thick).

The free magnetic layer 40 is shown with double arrows to illustrate that spin torque current (or spin polarized current) via voltage source 75 can flip the magnetic orientation of the free magnetic layer 40 to up or down as desired. The reference magnetic layer 20 is shown with an up arrow to illustrate a magnetic orientation in the up direction.

To write the STT-RAM device 100, the voltage source 75 applies voltage such that a spin torque current may flip the magnetic orientation of the free magnetic layer 40 as desired. When the magnetic orientations of the free magnetic layer 40 and the reference magnetic layer 20 are parallel (i.e., pointing in the same direction), the resistance of the MTJ 70 is low (e.g., representing logic 0). When the magnetic orientations of the free magnetic layer 40 and the reference magnetic layer 20 are antiparallel (i.e., pointing in opposite directions), the resistance of the MTJ 70 is high (e.g., representing a logic 1).

FIG. 2B illustrates an example of the STT-RAM device 200 in which the free magnetic layer 40 is implemented (or replaced) with the device 100 according to an embodiment. The device 100 can also implement the tunnel barrier 30 or vice versa as seen below.

In FIG. 2B, the device 200 includes the layers 10, 20, 30, 40, and 50. The free magnetic layer 40 now includes the bottom oxide layer 115, the magnetic layer 110 with iron, and the top oxide layer 105 (of device 100). In this case, the bottom oxide layer 115 is disposed directly on the reference layer 20, and the bottom oxide layer 115 acts as the tunnel barrier 30. The cap layer 50 is disposed on the top oxide layer 105. As such, the device 100 with its perpendicular magnetization is utilized as the free magnetic layer 40. Operating as the free magnetic layer 40, the device 100 can have an upward pointing magnetization or a downward pointing magnetization based on applying voltage of the voltage source 75 to generate spin current as understood by one skilled in the art.

As another example of utilizing the device 100 for its perpendicular magnetic anisotropy, FIG. 2C illustrates an example of the STT-RAM device 200 in which the reference magnetic layer 20 is implemented (or replaced, or partly replaced) with the device 100 according to an embodiment. Note that part of the device 100 may implement the tunnel barrier 30 or vice versa.

In FIG. 2C, the device 200 includes the layers 10, 20, 30, 40, and 50. The reference magnetic layer 20 now includes the bottom oxide layer 115, the magnetic layer 110 with iron, and the top oxide layer 105 (of device 100). The bottom oxide layer 115 is disposed on the seed layer 10, and the free magnetic layer 40 is disposed on the top oxide layer 105 (wherein the top oxide layer 105 acts as the tunnel barrier layer 30) of the device 100. Accordingly, the device 100 with its perpendicular magnetization is utilized as the reference magnetic layer 20. Operating as the reference magnetic layer 20, the device 100 may have a downward pointing magnetization that provides a reference layer to the free magnetic layer 40.

FIG. 2D illustrates an example of the STT-RAM device 200 in which both the free magnetic layer 40 and the reference magnetic layer 20 (or part of the reference magnetic layer) are respectively implemented (or replaced) with the devices 100 according to an embodiment. In this case, the reference layer 20 and the free layer 40 are sharing an oxide layer. When referring to the reference layer 20, the shared oxide layer is referred to as top oxide layer 105a (which may be the same as top oxide layer 105). When referring to the free magnetic layer 40, the shared oxide layer is referred to as bottom oxide layer 115a (which may be the same as bottom oxide layer 115).

In FIG. 2D, the reference magnetic layer 20 or part of the reference magnetic layer 20 is formed by the bottom oxide layer 115, the magnetic layer 110a with iron, and the top oxide layer 105a (of device 100). The bottom oxide layer 115 is disposed on the seed layer 10, and the top oxide layer 105a acts as the tunnel barrier 30. Accordingly, the device 100 with its perpendicular magnetization is utilized as the reference magnetic layer 20 to provide a reference layer to the free magnetic layer 40 (e.g., during reading).

Also, in FIG. 2D, the free magnetic layer 40 includes the same bottom oxide layer 115a (acting as the tunnel barrier 30), the magnetic layer 110b with iron, and the top oxide layer 105 (of device 100). The cap layer 50 is then disposed on the top oxide layer 105. As such, a separate device 100 with its perpendicular magnetization is also utilized as is the free magnetic layer 40. Note that the magnetic layers 110a and 110b are the same material of the magnetic layer 110.

Note that although FIGS. 2A through 2D shows the free magnetic layer 40 above the reference magnetic layer 20, the location of the free magnetic layer 40 and the reference magnetic layer 20 can be interchanged such that the free magnetic layer 40 is below the reference magnetic layer 20. In this case, the free magnetic layer 40 would be located in the previous location of the reference magnetic layer 20, and likewise the reference magnetic layer 20 would be located in the previous location of the free magnetic layer 40.

Another example of utilizing the perpendicular magnetic anisotropy device 100 is discussed in FIG. 3. FIG. 3 illustrates a hard disk drive (HDD) 300 with the perpendicular magnetic anisotropy device 100 (magnetic recording media) according to an embodiment. A hard disk drive is a data storage device used for storing and retrieving digital information using rapidly rotating disks (platters) coated with magnetic material.

The HDD 300 includes a disk/platter 305. One or more of the devices 100 are deposited to cover the disk/platter 305. In the sandwiched structure discussed above, the device 100 includes the bottom oxide layer 115, the Fe magnetic layer 110 adjacent to the bottom oxide layer 115, and the top oxide layer 105 adjacent to magnetic layer 110. Note that the individual layers 105, 110, and 115 are not repeated in FIG. 3 for the sake of conciseness but are understood to be part of the device 100.

The HDD 300 retains its data even when powered off. Data is read in a random-access manner, which means individual blocks of data can be stored or retrieved in any order rather than just sequentially. The HDD has one or more rigid ("hard") rapidly rotating disks (platters) 300 with magnetic heads 310 arranged on a moving actuator arm 315 to read and write data to the device 100. As shown in FIG. 3, the magnetic head 310 reads and writes to the device 100 by applying a magnetic field to flip the magnetic orientation of the device 100 (e.g., upward or downward pointing magnetic orientation). Further details of reading and writing with a hard disk drive are not discussed but are understood by one skilled in the art.

FIG. 4 illustrates a method 400 for forming a three layer structure device 100 with perpendicular magnetic anisotropy according to an embodiment. Reference can be made to FIGS. 1, 2, and 3.

The bottom oxide layer 115 is deposited at block 405, and the magnetic layer 110 is deposited on top of and adjacent to the bottom oxide layer 115. The magnetic layer 110 includes iron and is magnetized perpendicularly to the longitudinal plane of the magnetic layer 110 (and the device 100). Note that the longitudinal plane of the magnetic layer 110 is the lengthwise direction (i.e., horizontal direction) from left to right (of vice versa) in the cross-sectional views of FIGS. 1A, 2B, 2C, and 2D, while the perpendicular direction is vertical (e.g., up and down or vice versa).

The top oxide layer 105 is deposited on top of and adjacent to the magnetic layer 110 at block 415 to form the perpendicular magnetic anisotropy device 100.

The bottom oxide layer 115 may be MgO. Also, the bottom oxide layer includes at least one of MgO, AlOx, HfOx, TiOx, TaOx, CuOx, VOx, RuOx, SiOx, WOx, BOx, CaOx, ScOx, ZnOx, CrOx, MnOx, and combinations thereof.

The top oxide layer 105 may be MgO. Additionally, the top oxide layer 105 includes at least one of MgO, AlOx, HfOx, TiOx, TaOx, CuOx, VOx, RuOx, SiOx, WOx, BOx, CaOx, ScOx, ZnOx, CrOx, MnOx, and combinations thereof.

The magnetic layer 110 may be CoFeB. Further, the magnetic layer includes at least one of CoFe, CoFeB, CoFeBTa, and combinations thereof.

With reference to FIG. 2, a free magnetic layer 40 in a spin torque MRAM device 200 may be formed by the bottom oxide layer 115, the Fe containing magnetic layer 110, and the top oxide layer 105 of device 100. Also, a reference magnetic layer 20 in a spin torque MRAM device 200 may be formed by the bottom oxide layer 115, the Fe containing magnetic layer 110, and the top oxide layer 105 of device 100.

With reference to FIG. 3, a disk/patter 305 in a hard disk drive 300 is formed by deposition of the bottom oxide layer 115, the magnetic layer 110, and the top oxide layer 105 (to be the storage media for reading and writing).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A spin torque MRAM structure with perpendicular magnetic anisotropy, comprising:
   a bottom oxide layer directly on a seed layer;
   a magnetic layer disposed directly on top of the bottom oxide layer, wherein the magnetic layer includes iron and is magnetized perpendicularly to a longitudinal plane of the magnetic layer, and wherein the bottom oxide layer includes at least one of AlOx, HfOx, CuOx, RuOx, SiOx, WOx, BOx, CaOx, ScOx, ZnOx, CrOx, MnOx, and combinations thereof;
   a top oxide layer disposed directly on top of the magnetic layer, wherein the top oxide layer includes at least one of CuOx, WOx, BOx, CaOx, ScOx, ZnOx, CrOx, MnOx, and combinations thereof, and wherein a reference magnetic layer comprises a sandwich of the bottom oxide layer, the magnetic layer, and the top oxide layer;
   a free magnetic layer disposed directly on top of the top oxide layer; and
   a cap layer disposed on top of the free magnetic layer.

2. The structure of claim 1, wherein the bottom oxide layer includes MgO.

3. The structure of claim 1, wherein the top oxide layer includes MgO.

4. The structure of claim 1, wherein the magnetic layer is CoFeB.

5. The structure of claim 1, wherein the magnetic layer includes CoFeBTa.

6. The structure of claim 1, wherein the free layer in the spin torque MRAM is formed by the top oxide layer, another magnetic layer, and a second top oxide layer.

* * * * *